United States Patent
Ravid et al.

(10) Patent No.: US 6,512,402 B2
(45) Date of Patent: Jan. 28, 2003

(54) METHOD AND APPARATUS FOR SHIFTING THE FREQUENCY SPECTRUM OF NOISE SIGNALS

(75) Inventors: Shmuel Ravid, Haifa (IL); Dany Rettig, Karkur (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/823,255

(22) Filed: Mar. 30, 2001

(65) Prior Publication Data

US 2002/0167352 A1 Nov. 14, 2002

(51) Int. Cl.$^7$ .................................................. H03L 7/00
(52) U.S. Cl. ........................ 327/141; 327/144; 327/295; 327/551
(58) Field of Search ................................ 327/269, 271, 327/291, 292, 295, 297, 551, 141, 144, 152, 153

(56) References Cited

U.S. PATENT DOCUMENTS

| | | | | |
|---|---|---|---|---|
| 4,348,640 A | * | 9/1982 | Clendening | 377/47 |
| 5,764,998 A | * | 6/1998 | Deshpande | 395/733 |
| 6,020,773 A | * | 2/2000 | Kan et al. | 327/271 |
| 6,046,607 A | | 4/2000 | Kohdaka | |
| 6,275,087 B1 | | 8/2001 | Dehghan | |
| 6,285,768 B1 | | 9/2001 | Ikeda | |

FOREIGN PATENT DOCUMENTS

| | | |
|---|---|---|
| EP | 571 209 A2 | 11/1993 |
| JP | 08330917 | 12/1996 |
| JP | 11007349 | 1/1999 |
| JP | 2001084053 | 9/1999 |

OTHER PUBLICATIONS

Ultra320 White Paper, www.maxtor.com/Quantum/src/whitepapers/wp_ultra320.htm, pp. 2 through 5, Aug. 31, 2001.

* cited by examiner

Primary Examiner—Timothy P. Callahan
Assistant Examiner—An T. Luu
(74) Attorney, Agent, or Firm—Blakely, Sokoloff, Taylor & Zafman LLP (57) ABSTRACT

A method and apparatus for generating a first clock signal and a second time staggered clock signal; and driving a first circuit with the first clock signal and a second circuit with the second time staggered clock signal, to cause unwanted signals due to the first clock signal and unwanted signals due to the second time staggered clock signal to occur at frequencies that are a multiple of the first clock frequency. The method and apparatus further comprising synchronizing outputs from the first circuit and the second circuit to facilitate transfer of information therebetween.

20 Claims, 7 Drawing Sheets

METHOD AND APPARATUS FOR SHIFTING THE FREQUENCY SPECTRUM OF NOISE SIGNALS

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

BACKGROUND OF THE INVENTION

1. Field of the Invention

The present invention is related to the field of electronics. In particular, the present invention is related to a method and apparatus for shifting the frequency spectrum of noise signals in electronic circuits.

2. Description of the Related Art

Figure 1:
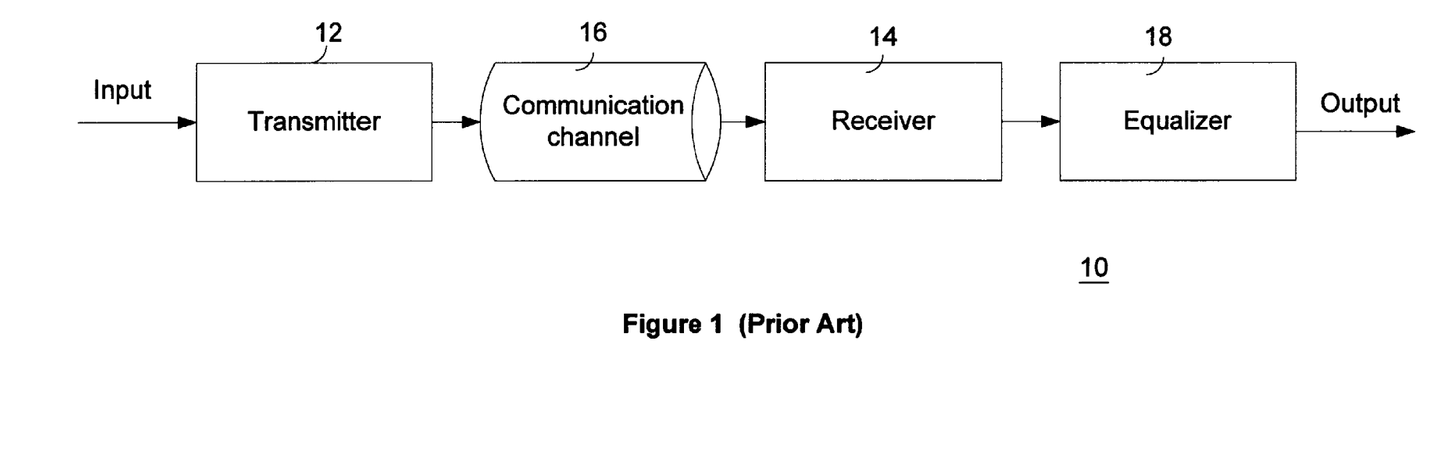
FIG. 1 illustrates a prior art embodiment of a communication system.

The existence of noise in electronic circuits may cause the circuits to malfunction. This is especially true in electronic communication devices wherein the existence of noise has the potential to drown out or distort the desired signals. The effects of noise in electronic circuits is illustrated with reference to FIGS. 1–3. FIG. 1 illustrates a block diagram of a conventional communication system 10. Communication system 10 includes a transmitter 12, a receiver 14 and a communication channel 16. Communication channel 16 may be either a wired or wireless communication channel.

Figure 2:
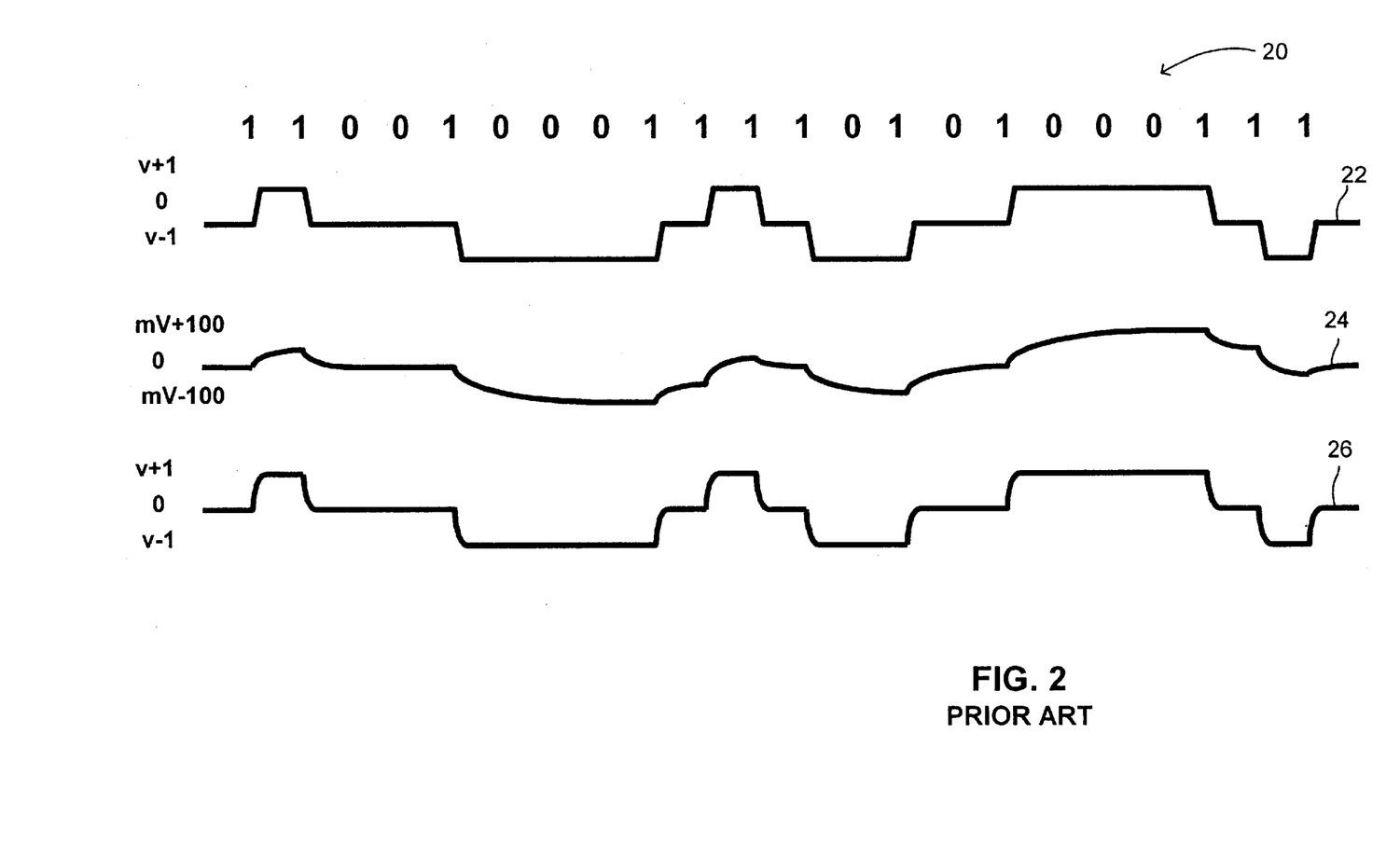
FIG. 2 illustrates waveforms at various points in the prior art embodiment of a communication system.

FIG. 2 illustrates a sequence of waveforms, for example, as may be transmitted over communication system 10. Input signal 20 is a binary signal and comprises a sequence of binary values received by transmitter 12 of FIG. 1. Transmitter 12 converts the binary input signal into a bipolar signal 22, having a positive and a negative component. The bipolar signal 22 is transmitted to receiver 14 via communication channel 16. In one embodiment, transmitter 12 may modulate bipolar signal 22 onto a carrier wave prior to transmitting the signal to receiver 14.

As bipolar signal 22 propagates through communication channel 16, the signal may become deformed and attenuated as illustrated by waveform 24 in FIG. 2. Receiver 14 receives attenuated signal 24 and transmits it to equalizer (wave shaper) 18. Equalizer 18 amplifies and processes signal 24, producing a reconstructed signal 26, which is more or less a replica of bipolar signal 22.

At the input of equalizer 18 both the desired input signal 20, and unwanted noise signals are present and, hence, amplified by the equalizer. If the noise signals are of significant amplitude, i.e., if the noise signals have an amplitude larger than the desired signal and have a substantially similar frequency as the desired input signal 20, the noise signals may distort the desired signal. In this case, the equalizer would be unable to reconstruct the desired signal.

In order to propagate a desired input signal 20 through e.g., a communication system 10, switching circuits driven by clock signals often are employed in the receiver 14 and equalizer 18. As such, the undesired signals, for example, noise signals generated by the clock signals and the associated switching circuitry are at frequencies that are multiples of the clock signal frequency. The noise signal frequencies normally fall within the bandwidth of amplifiers in the communication system 10, and subsequently both the desired input signal 20 and the noise signals are amplified. Moreover, since the amplitude of the noise signals, of a particular frequency, generated by different switching circuits in the system are additive, noise signals from the various switching circuits may be superimposed on each other to form noise signals of greater amplitude, exaggerating the problem.

Figure 3:
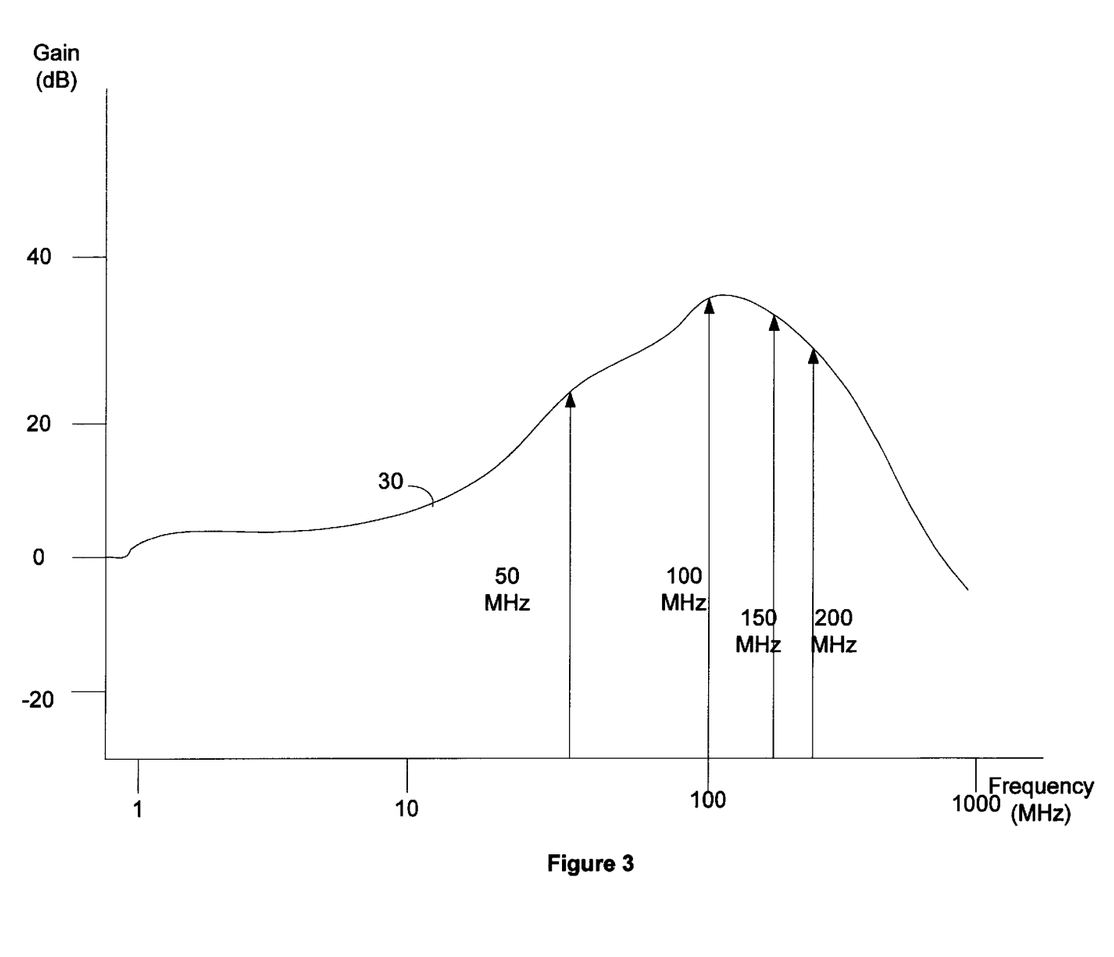
FIG. 3 illustrates a gain versus frequency curve of signals present at the input of an equalizer of a prior art communication system.

FIG. 3 illustrates a waveform showing the gain versus frequency curve of various signals at the input of equalizer 18. As FIG. 3 illustrates, the desired input signal 20 has a frequency of 100 MHz, a clock signal has a frequency of 25 MHz, harmonics of the clock signal have frequencies of 50 MHz, 100 MHz, 150 MHz etc. All the frequencies illustrated are present at the input of the equalizer 18. Hence, as the desired 100 MHz input signal 20 is amplified by the equalizer, so too are the undesired noise signals.

Conventional noise reduction methods and systems attempt to increase output signal quality by reducing the induced noise signals via the use of filter circuits. Using filter circuits to eliminate noise signals is not very effective, as noise signals induced by clock transitions, and with frequencies substantially similar to the desired signal frequency cannot be easily filtered out. What is needed, therefore, is a method and apparatus to reduce noise signals in electronic devices by shifting the frequency spectrum of noise signals to frequencies outside the bandwidth of the amplifiers, or to frequencies that are outside the operating frequency of the electronic system.

BRIEF SUMMARY OF THE DRAWINGS

Examples of the present invention are illustrated in the accompanying drawings. The accompanying drawings, however, do not limit the scope of the present invention. Similar references in the drawings indicate similar elements.

DETAILED DESCRIPTION OF THE INVENTION

Described is a method and apparatus for shifting the frequency spectrum of noise signals to frequencies outside the bandwidth of amplifiers, or outside the operating frequencies of an electronic system. In the following description, numerous specific details are set forth in order to provide a thorough understanding of the present invention. It will be apparent, however, to one of ordinary skill in the art that the present invention may be practiced without these specific details. In other instances, well-known architectures, steps, and techniques have not been shown to avoid unnecessarily obscuring the present invention. For example, specific details are not provided as to whether the method is implemented in a transmitter, receiver, equalizer, modem, as a software routine, hardware circuit, firmware, or a combination thereof.

Parts of the description will be presented using terminology commonly employed by those skilled in the art to convey the substance of their work to others skilled in the art. Also, parts of the description will be presented in terms of operations performed through the execution of programming instructions. As well understood by those skilled in the art, these operations often take the form of electrical, magnetic, or optical signals capable of being stored, transferred, combined, and otherwise manipulated through, for instance, electrical components.

In addition, it should be understood that the programs, processes, method, etc. described herein are not related or limited to any particular computer or apparatus nor are they related or limited to any particular communication network architecture. Rather, various types of general purpose machines may be used with program modules constructed in accordance with the teachings described herein. Similarly, it may prove advantageous to construct a specialized apparatus to perform the method steps described herein by way of dedicated computer systems in a specific network architecture with hard-wired logic or programs stored in nonvolatile memory such as read only memory.

Various operations will be described as multiple discrete steps performed in turn in a manner that is helpful in understanding the present invention. However, the order of description should not be construed as to imply that these operations are necessarily performed in the order they are presented, or even order dependent. Lastly, repeated usage of the phrase "in one embodiment" does not necessarily refer to the same embodiment, although it may.

Figure 4:
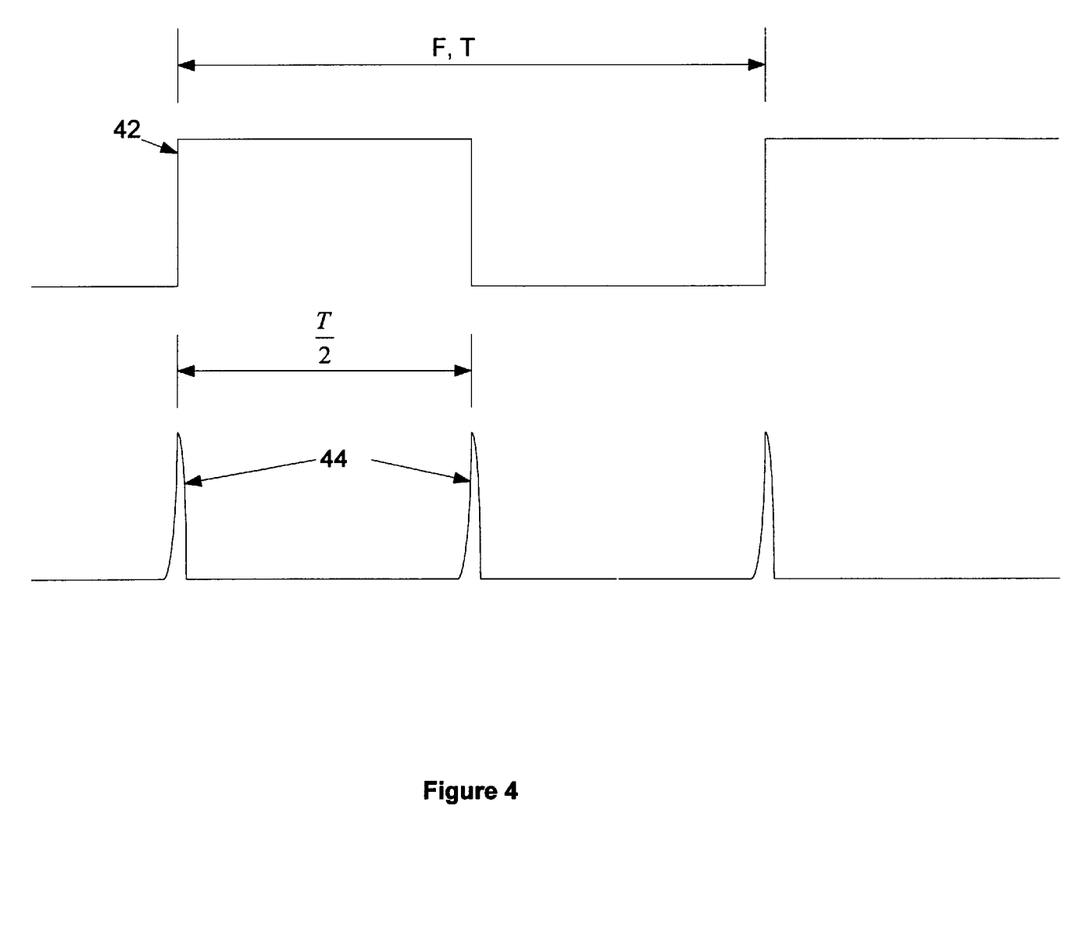
FIG. 4 illustrates a waveform of noise signals generated at clock signal transitions.

Turning now to the drawings, FIG. 4 illustrates a clock signal 42 with fundamental frequency F and time period T. As stated earlier, noise signals are generated during the transitions of the clock signals. Hence, as illustrated in FIG. 4, noise signals 44 are generated every $$\frac{T}{2}.$$

This means that undesired signals will be present at the fundamental clock frequency F and multiples thereof. For example, for a 25 MHz clock, noise signals will be generated at a fundamental noise frequency of 50 MHz, and harmonics of noise signals will be generated at frequencies that are multiples of the fundamental noise signal frequency. Thus, harmonic noise signals will be generated at frequencies of 100 MHz, 150 MHz, etc.

Figure 5:
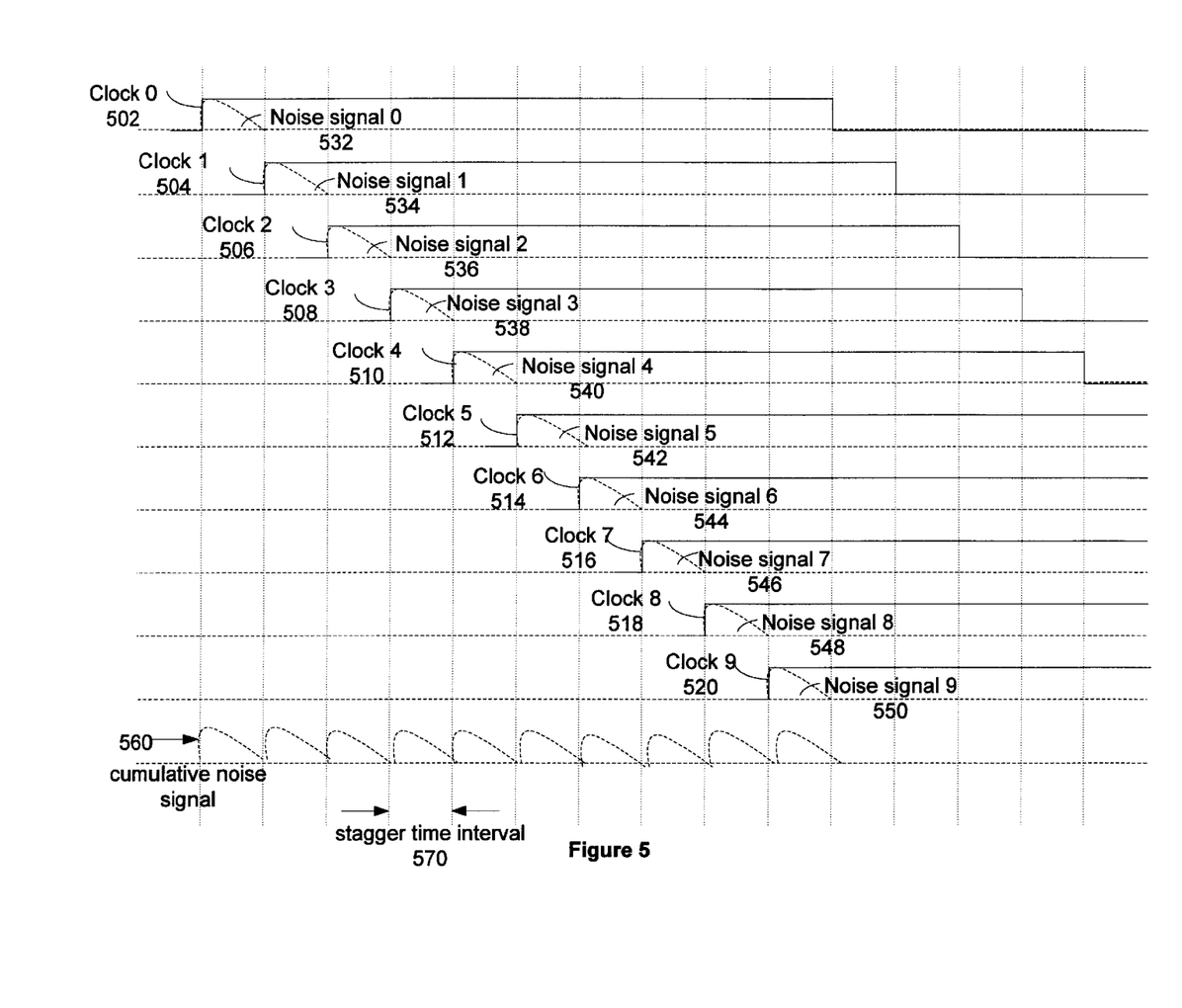
FIG. 5 illustrates shifting of the frequency spectrum of noise signals in accordance with one embodiment of the invention.

If a desired input signal, with a frequency of, for example, 100 MHz, is amplified, then the noise signals with frequencies in the bandwidth of amplifiers that amplify the desired input signal also will be amplified. However, to avoid amplifying the noise signals, FIGS. 5–7 illustrates one embodiment wherein the frequency spectrum of the noise signals is shifted outside the bandwidth of amplifiers.

Ten staggered clock signals, clock 0–clock 9, generated by, e.g., a staggered clock generator 730, are each used to drive a different circuit in an electronic system. Noise signals 532–550 are generated at the transition of each time staggered clock signal, and as a result, the frequency of the cumulative noise signal 560 occurs outside the bandwidth of the amplifiers in the circuit. In the example discussed above, a 25 MHz clock with a cycle time period of 40 nsec having a 2 nsec stagger interval produces a cumulative noise signal with a time period of 2 nsec, and hence a cumulative noise frequency 560 of 500 MHz. This cumulative noise frequency 560 is well away from the desired 100 MHz input signal. Therefore, when the desired input signal is amplified, the cumulative noise signal outside the bandwidth of the amplifiers in the circuit, is not amplified.

Figure 6:
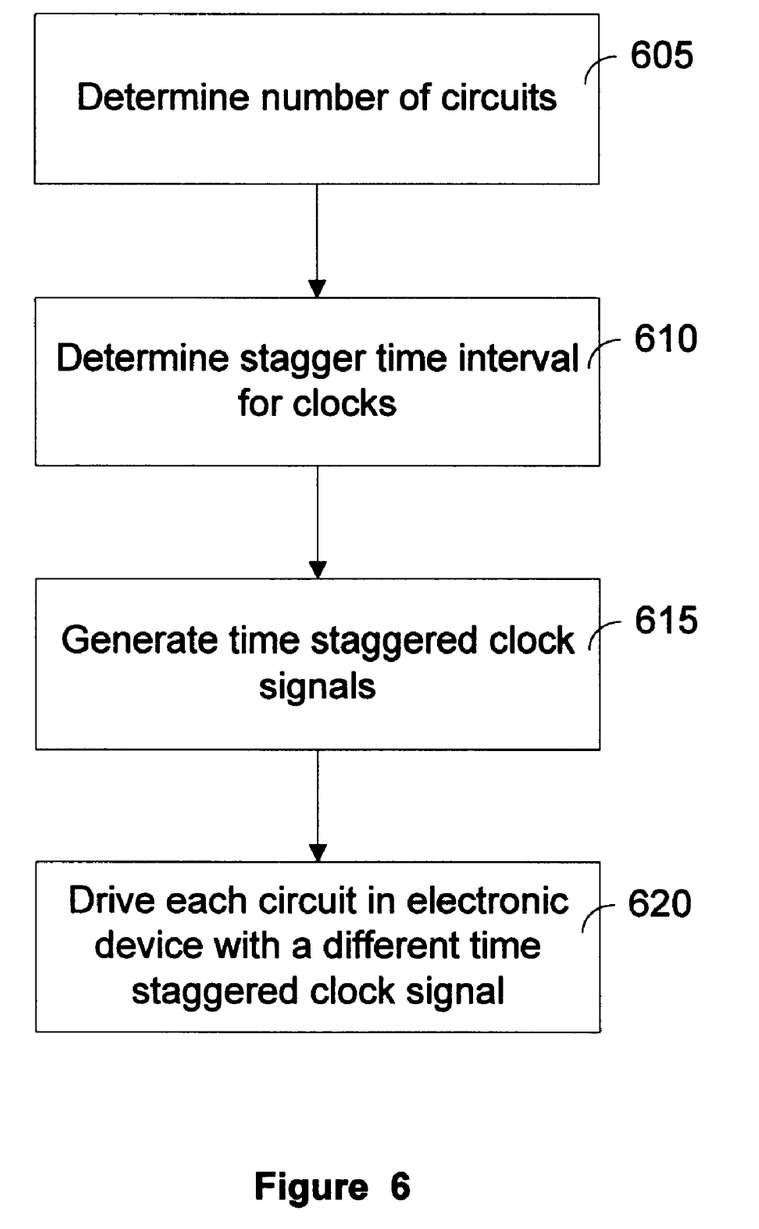
FIG. 6 illustrates a flow diagram for shifting the frequency spectrum of noise signals in accordance with one embodiment of the invention.
Figure 7:
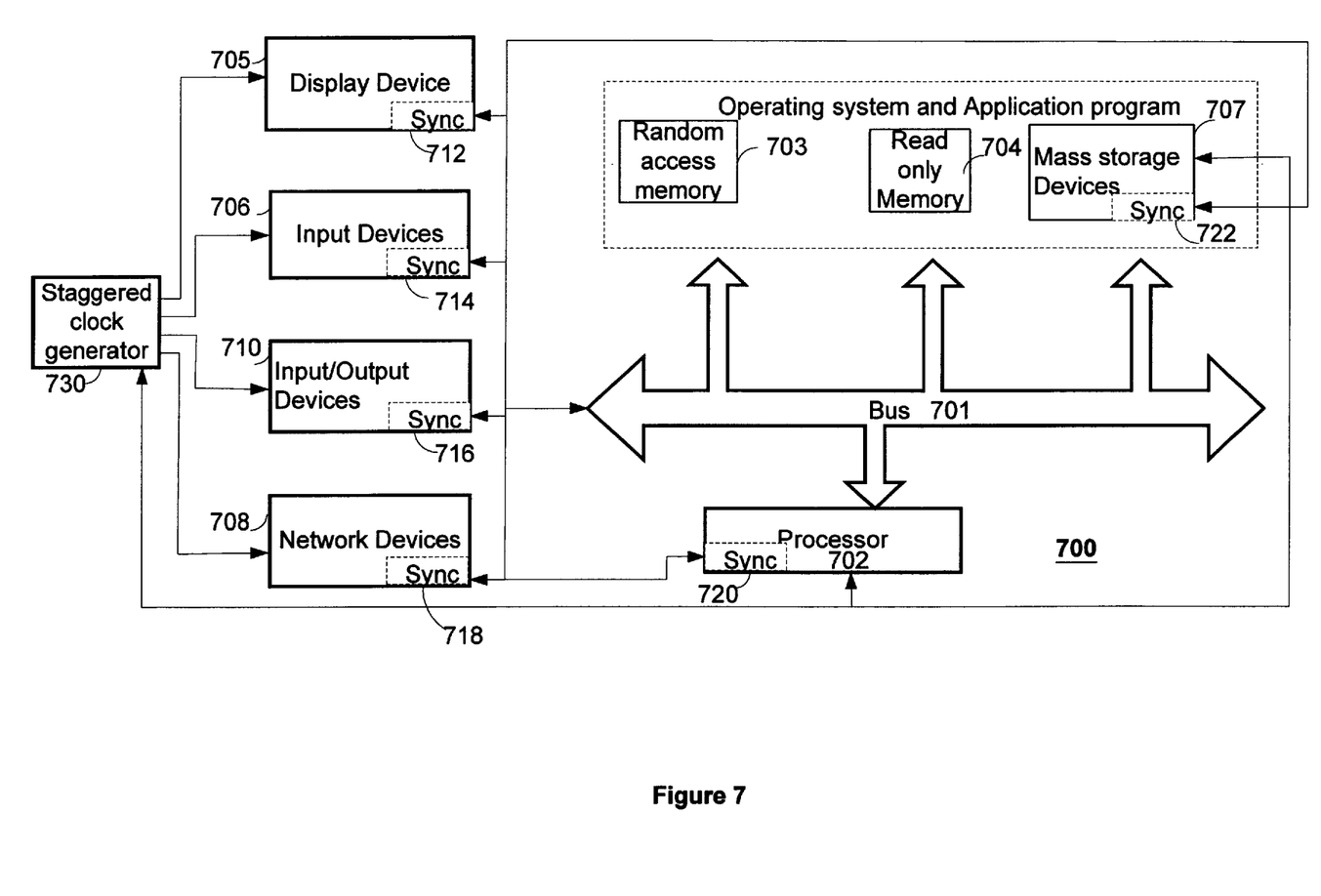
FIG. 7 illustrates an apparatus for shifting the frequency spectrum of noise signals in accordance with one embodiment of the invention.

FIG. 6 illustrates one embodiment of a method wherein the frequency spectrum of the induced noise signal is shifted to frequencies outside the bandwidth of the amplifiers in an electronic system. In other embodiments, the frequency spectrum of the induced noise signal is shifted to frequency that is much higher than the input signal frequency, or the operating frequency of the electronic device. As FIG. 6 illustrates at 605, the number of digital circuits in an electronic system, e.g., a communication system, driven by independent clock signals are identified. In one embodiment, a digital circuit driven by an independent clock signal may be embodied on a single integrated circuit chip, a group of integrated circuit chips or even on one or more circuit boards, locally or externally disposed, within the communication system. In one embodiment, the number of digital circuits identified equals the number of time staggered clock signals generated, e.g., by a staggered clock generator, in the electronic system. In other embodiments, more than one digital circuit may be driven by a clock signal so long as other digital circuits within the system are driven by staggered clock signals, and the frequency spectrum of the noise signal is shifted away from the input signal frequency of the electronic system.

At 610, the stagger time interval 570 for the time staggered clock signals is determined. In order to determine the stagger time interval, the fundamental clock time period of the system clock in the communication system is divided by two times the number of staggered clocks, i.e., by twice the number of circuits driven by the staggered clocks, to obtain the stagger time interval 570. Thus, for a 25 MHz clock with a time period of 40 nsec, with ten digital circuits capable of being driven by independent clock signals, the stagger time interval is $$\frac{40}{2 \times 10}$$

nsec, or 2 nsec. This produces a cumulative noise signal 560 of 500 MHz, which is a higher frequency as compared with the 100 MHz input signal. In the example above, the cumulative noise signal 560 has a frequency that is 20 times higher than the 25 MHz clock frequency. Hence, due to the time staggering of the system clock into multiple time staggered clocks wherein each clock is used to drive one or more circuits in the electronic system, unwanted signals, for example, noise signals are generated at frequencies that are a multiple of the system clock signal.

At 615, the time staggered clock signals are generated, for example, by a staggered clock generator, each time staggered clock signal having essentially the same frequency. At 620 each time staggered clock signal is used to drive a circuit in the communication system. In one embodiment, at least one synchronizing unit may be provided to coordinate the transfer of information between the circuits that are driven by the time staggered clock signals. In other embodiments, instead of staggering each clock signal by an equal amount, as illustrated above, other staggering schemes may be employed. For example, one which staggers the clocks by unequal amounts, such that the cumulative noise frequency is a multiple of the staggered clock frequency and occurs at a frequency that is high as compared with the operating frequency of the electronic system. In other embodiments, the cumulative noise frequency or the frequency spectrum of the noise signals generated as a result of staggering the clock signals by an unequal amount is high as compared with the input signal in the communication system.

FIG. 7 is a block diagram of a computer system that uses time staggered clock signals to shift the frequency spectrum of the induced noise signals outside the operating frequency of the computer system. In general, such computer systems as illustrated in FIG. 7 include a processor 702 coupled through a bus 701 to a random access memory (RAM) 703, a read only memory (ROM) 704, and a mass storage device 707. Mass storage device 707 represents a persistent data storage device, such as a floppy disk drive, fixed disk drive (e.g., magnetic, optical, magneto-optical, or the like), or streaming tape drive. Processor 702 may be any of a wide variety of general purpose processors or microprocessors (such as the Pentium® processor manufactured by Intel® Corporation), a special purpose processor, or a specifically programmed logic device.

Display device 705 is coupled to processor 702 through bus 701 and provides graphical output for computer system 700. Input devices 706 such as a keyboard or mouse are coupled to bus 701 for communicating information and command selections to processor 702. Also coupled to processor 702 through bus 701 is an input/output interface 710 which can be used to control and transfer data to electronic devices (printers, other computers, etc.) connected to computer system 700. Computer system 700 includes network devices 708 for connecting computer system 700 to a remote device such as a router or gateway. Network devices 708, may include Ethernet devices, phone jacks and satellite links. It will be apparent to one of ordinary skill in the art that other network devices may also be utilized.

In one embodiment, as illustrated in FIG. 7, a staggered clock generator 730 generates time staggered clock signals, and drives the various circuits in computer system 700. The invention may utilize synchronizing units 712–722 in the staggered clock generator unit 730, or in each circuit that is driven by the time staggered clock signal, to synchronize and to coordinate the transfer of information between the circuits. One embodiment of the invention may be embedded in a hardware product, for example, in a printed circuit board, in a special purpose processor, or in a specifically programmed logic device communicatively coupled to bus 701. Other embodiments of the invention may include a combination of a hardware product and software product. For example, the staggered clock generator and corresponding synchronizing units may be software programmable to generate the time staggered clock signals, and to coordinate the data outputs from the various circuits that utilize the time staggered clock signals.

Embodiments of the invention may be represented as a software product stored on a machine-accessible medium (also referred to as a computer-accessible medium or a processor-accessible medium). The machine-accessible medium may be any type of magnetic, optical, or electrical storage medium including a diskette, CD-ROM, memory device (volatile or non-volatile), or similar storage mechanism. The machine-accessible medium may contain various sets of instructions, code sequences, configuration information, or other data. Those of ordinary skill in the art will appreciate that other instructions and operations necessary to implement the described invention may also be stored on the machine-accessible medium.

Thus a method and apparatus have been disclosed for shifting the noise spectrum in electronic devices to frequencies outside the bandwidth of amplifiers within the electronic device, or outside the operating frequencies of electronic devices. While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. A method comprising:

generating a first clock signal and a second time staggered clock signal, said second time staggered clock signal having a time shift proportional to the time period of a noise signal; and driving a first circuit with the first clock signal and a second circuit with the second time staggered clock signal, causing a first noise signal due to the first clock signal and a second noise signal due to the second time staggered clock signal to occur at or near the time period of the noise signal.

2. The method of claim 1 further comprising synchronizing outputs from the first circuit and the second circuit, using a synchronizer, to coordinate transfer of information between time staggered clock circuits.

3. The method of claim 1 wherein the second time staggered clock signal has the same frequency as the first clock signal.

4. The method of claim 1 further comprising:

generating a third time staggered clock signal having the same frequency as the first clock signal; and driving a third circuit with the third time staggered clock signal, wherein the time interval between starting of the third time staggered clock signal and starting of the second time staggered clock signal is equal to the time interval between starting of the second time staggered clock signal and starting of the first clock signal.

5. The method of claim 1 further comprising:

generating a third time staggered clock signal having the same frequency as the first clock signal; and driving a third circuit with the third time staggered clock signal, wherein the time interval between starting of the third time staggered clock signal and starting of the second time staggered clock signal is not equal to the time interval between starting of the second time staggered clock signal and starting of the first clock signal.

6. An apparatus comprising:

means for generating a first clock signal and a second time staggered clock signal said second time staggered clock signal having a time shift proportional to the time period of a noise signal; and means for driving a first circuit with the first clock signal and a second circuit with the second time staggered clock signal, causing a first noise signal due to the first clock signal and a second noise signal due to the second time staggered clock signal to occur at or near the time period of the noise signal.

7. The apparatus as in claim 6 further comprising means for synchronizing outputs from the first circuit and the second circuit, using a synchronizer, to coordinate transfer of information between time staggered clock circuits.

8. The apparatus as in claim 6 wherein the second time staggered clock signal has the same frequency as the first clock signal.

9. The apparatus as in claim 6 further comprising:
means for generating a third time staggered clock signal having the same frequency as the first clock signal; and
means for driving a third circuit with the third time staggered clock signal, wherein the time interval between starting of the third time staggered clock signal and starting of the second time staggered clock signal is equal to the time interval between starting of the second time staggered clock signal and starting of the first clock signal.

10. The apparatus as in claim 6 further comprising:
means for generating a third time staggered clock signal having the same frequency as the first clock signal; and
means for driving a third circuit with the third time staggered clock signal, wherein the time interval between starting of the third time staggered clock signal and starting of the second time staggered clock signal is not equal to the time interval between starting of the second time staggered clock signal and starting of the first clock signal.

11. An apparatus comprising:
a staggered clock generator to generate a first clock signal and a second time staggered clock signal, said second time staggered clock signal having a time shift proportional to the time period of a noise signal, to drive a first circuit with the first clock signal and a second circuit with the second time staggered clock signal, causing a first noise signal due to the first clock signal and a second noise signal due to the second time staggered clock signal to occur at or near the time period of the noise signal.

12. An apparatus as in claim 11 further comprising a synchronizer to synchronize outputs from the first circuit and the second circuit to coordinate transfer of information between time staggered clock circuits.

13. An apparatus as in claim 11 wherein the second time staggered clock signal has the same frequency as the first clock signal.

14. An apparatus as in claim 11 wherein the staggered clock generator generates a third time staggered clock signal, having the same frequency as the first clock signal, to drive a third circuit with the third time staggered clock signal, wherein the time interval between start of the third time staggered clock signal and start of the second time staggered clock signal, is equal to the time interval between start of the second time staggered clock signal and start of the first clock signal.

15. An apparatus as in claim 11 wherein the staggered clock generator generates a third time staggered clock signal, having the same frequency as the first clock signal, to drive a third circuit with the third time staggered clock signal, wherein the time interval between start of the third time staggered clock signal and start of the second time staggered clock signal, is not equal to the time interval between start of the second time staggered clock signal and start of the first clock signal.

16. A computer system comprising:
a bus;
a data storage device coupled to said bus;
a processor coupled to the data storage device; and
a staggered clock generator to generate a first clock signal and a second time staggered clock signal, said second time staggered clock signal having a time shift proportional to the time period of a noise signal to drive a first circuit with the first clock signal and a second circuit with the second time staggered clock signal, causing a first noise signal due to the first clock signal and a second noise signal due to the second time staggered clock signal to occur at or near the time period of the noise signal.

17. A computer system as in claim 16 further comprising a synchronizer to coordinate outputs from the first circuit and the second circuit to coordinate transfer of information between time staggered clock circuits.

18. A computer system as in claim 16 wherein the second time staggered clock signal has the same frequency as the first clock signal.

19. A computer system as in claim 16 wherein the staggered clock generator generates a third time staggered clock signal, having the same frequency as the first clock signal, to drive a third circuit with the third time staggered clock signal, wherein the time interval between start of the third time staggered clock signal and start of the second time staggered clock signal, is equal to the time interval between start of the second time staggered clock signal and start of the first clock signal.

20. A computer system as in claim 16 wherein the staggered clock generator generates a third time staggered clock signal, having the same frequency as the first clock signal, to drive a third circuit with the third time staggered clock signal, wherein the time interval between start of the third time staggered clock signal and start of the second time staggered clock signal, is not equal to the time interval between start of the second time staggered clock signal and start of the first clock signal.

* * * * *